United States Patent [19]

Stopper et al.

[11] Patent Number: 4,920,454

[45] Date of Patent: Apr. 24, 1990

[54] WAFER SCALE PACKAGE SYSTEM AND HEADER AND METHOD OF MANUFACTURE THEREOF

[75] Inventors: Herbert Stopper, Orchard Lake; Cornelius C. Perkins, Birmingham, both of Mich.

[73] Assignee: Mosaic Systems, Inc., Troy, Mich.

[21] Appl. No.: 217,146

[22] Filed: Jul. 1, 1988

Related U.S. Application Data

[63] Continuation of Ser. No. 581,975, Feb. 21, 1984, abandoned, which is a continuation-in-part of Ser. No. 532,391, Sep. 15, 1983, abandoned.

[51] Int. Cl.[5] .......... H05K 1/00

[52] U.S. Cl. .......... 361/398; 361/401; 357/80; 174/52.4

[58] Field of Search .......... 361/401, 403, 398, 406, 361/408, 409, 400; 357/457, 80; 174/52 FP, 68 R, 68.5

[56] References Cited

U.S. PATENT DOCUMENTS

| | | | |
|---|---|---|---|
| 3,657,805 | 4/1972 | Johnson | 29/589 |
| 3,699,543 | 10/1972 | Neale | 340/173 R |
| 3,781,683 | 12/1973 | Freed | 324/158 F |
| 3,803,709 | 4/1974 | Beltz et al. | 357/70 |
| 3,983,479 | 9/1976 | Lee et al. | 324/158 R |
| 4,021,838 | 5/1977 | Warwick | 357/68 |
| 4,048,438 | 9/1977 | Zimmerman | 357/80 X |
| 4,074,342 | 2/1978 | Honn et al. | 361/411 |
| 4,220,917 | 9/1980 | McMahon, Jr. | 324/73 R |
| 4,246,595 | 1/1981 | Noyori et al. | 357/70 |
| 4,257,061 | 3/1981 | Chapel, Jr. et al. | 357/69 |
| 4,320,438 | 3/1982 | Ibarhim et al. | 361/401 |
| 4,413,308 | 11/1983 | Brown | 361/401 X |
| 4,458,297 | 7/1984 | Stopper et al. | 361/403 |
| 4,479,088 | 10/1984 | Stopper | 324/73 R |
| 4,481,559 | 11/1985 | Buck et al. | 361/398 X |
| 4,484,215 | 11/1984 | Pappas | 357/80 |

FOREIGN PATENT DOCUMENTS

| | | |
|---|---|---|
| 8202603 | 5/1982 | European Pat. Off. . |
| 8202640 | 5/1982 | European Pat. Off. . |

OTHER PUBLICATIONS

Bodendor F et al, *IBM Technical Disclosure Bulletin, Active Silicon Chip Carrier, vol. 15, No. 2, (7/72).*

32nd Electronic Components Conference, May 10–12, 1982, San Diego, pp. 7–16; IEEE, New York, U.S., Y. Hsia et al.: "A reconfigurable interconnect for insilicon electronic assembly".

"Semiconductor Process Defect Monitor", Ghatalia et al., IBM Technical Disclos. Bulletin, vol. 17, No. 9, Feb. 1975.

"Pluggable-Module Power-Connection Mechanism", IBM Technical Disclosure Bulletin, vol. 27, No. 10A, Mar., 1985.

"Test Structure for Semiconductor Chips", N. E. Hallas et al, IBM Technical Disclosure Bulletin, vol. 19, No. 3, Aug., 1976.

"Monster Chips: The Most Integrated Circuits Yet", BusinessWeek, Sep. 26, 1983, pp. 148D, 148F, 148H.

*Primary Examiner*—Todd E. Deboer

*Attorney, Agent, or Firm*—Harness, Dickey & Pierce

[57] ABSTRACT

Disclosed is a wafer scale device 10, 201 on which is formed a layer of thin film as an interconnection system 203 with contact sites 202, 207 between the interconnection system 203 and die bonding sites 202 of the wafer 10, 201 to form a monolithic wafer. The interconnection system 203 has bonding sites on the surface of the wafer 10, 201 to which chips 11 are bonded to form a hybrid monolithic wafer system. The wafer 10 is packaged within a wafer package, FIG. 4, and the packaging system utilizes a header 20 which is a flexible circuit connector between the wafer package and first level circuit board 30.

11 Claims, 10 Drawing Sheets

WAFER SCALE PACKAGE SYSTEM AND HEADER AND METHOD OF MANUFACTURE THEREOF

RELATED APPLICATIONS

This is a continuation of U.S. patent application Ser. No. 581,975, filed Feb. 21, 1984 now abandoned, which is a continuation-in-part of U.S. Ser. No. 532,391 filed Sept. 15, 1983, now abandoned.

BACKGROUND OF THE INVENTION

This invention relates to a Wafer Scale Package System and Header and Method of Manufacture Thereof. The "chip", which is a basis of many of today's computer and electronic devices, an important application will be replaced by wafer scale devices. A wafer cannot perform this intended function without connection to the outside world. A wafer scale device of the type disclosed in U.S. Ser. No. 225,581 filed Jan. 16, 1981 now abandoned and continued as U.S. Ser. No. 445,156 filed Nov. 29, 1982, issued on July 3, 1984 as U.S. Pat. No. 4,467,400, entitled Universal Interconnection Substrate, Stopper et al, is a kind of wafer scale device to which the present application is directed. In the past, devices similar to that described in the application entitled "Universal Interconnection Substrate" were mounted in a printed circuit board and directly connected to the circuit board in the manner shown in *Business Week*, Sept. 26, 1983, page 148-D. The state of the art today however generally is to the effect that small "chips" are packaged in a chip package which has within the ceramic or plastic packaging spider-like leads which lead to pins external of the package which are pressed into a connector on a printed circuit board.

A driving force between wafer force integration is that when interconnecting substrates are packaged as wafer scale devices the circuit density of the integrated circuits is increased and the distance between logic and between logic and memory become closer increasing reliability and speed. However, mechanical connection between wafers and circuit boards has to be improved in order to take advantage of increasing reliability and speed. The wafer scale devices must be connected to the outside world.

SUMMARY OF THE INVENTION

In contrast to this present state of the art, we have been working on a new level of technology, which we call wafer scale integration. This technology utilizes the entire wafer to make a system package, as opposed to a chip package. To understand the technology, gates, diodes, resistors and other well known electrical elements are fundamental units of a circuit, and a circuit in turn is a sub-element of a die, and the die or "chip" is a sub-element of a wafer. The wafer itself, in a version of our monolithic wafer, is composed of a plurality of circuits and is capable of being an entire system. This system is of a scale much greater than the systems made on single chips for the first time approximately a decade ago. Chips during the last decade have been made which have an on board memory, an instruction processor and interconnection bus to the outside world.

By utilizing available VLSI technology and our wafer scale integration techniques we can reduce a room size mainframe computer to a single monolithic wafer. The dicing techniques can be eliminated. In addition, we have devised methods and techniques to combine circuits which are not made on a single wafer into a single unitized wafer.

These devices are not merely improvements to the state of the art, but raise much of the technology to a new level. In order to connect the wafer scale device to the outside world we have discovered and invented how the device can be employed in wide ranging temperature applications. The wafer itself is a thin, fragile, but large area sheet. We have developed a wafer package, and a device for mounting this package to a first level connector circuit which is in the form of a printed circuit board. This package mounting device we call a header. It is a flexible circuit which incorporates the circuit technology needed to support the wafer function, is mated with certain corresponding function elements of the wafer itself, and also with the support substrate board. The combined system is rugged, lightweight and useful in high as well as very low application temperature.

The particular elements which are part of our invention are described below. It should be understood that the substantial improvements, inventions and discoveries may be better understood by reference to the appended claims and the following detailed description with reference to the drawings in which:

FIG. 6 shows a corner portion of the header, while

DESCRIPTION OF PREFERRED EMBODIMENTS

Figure 1:
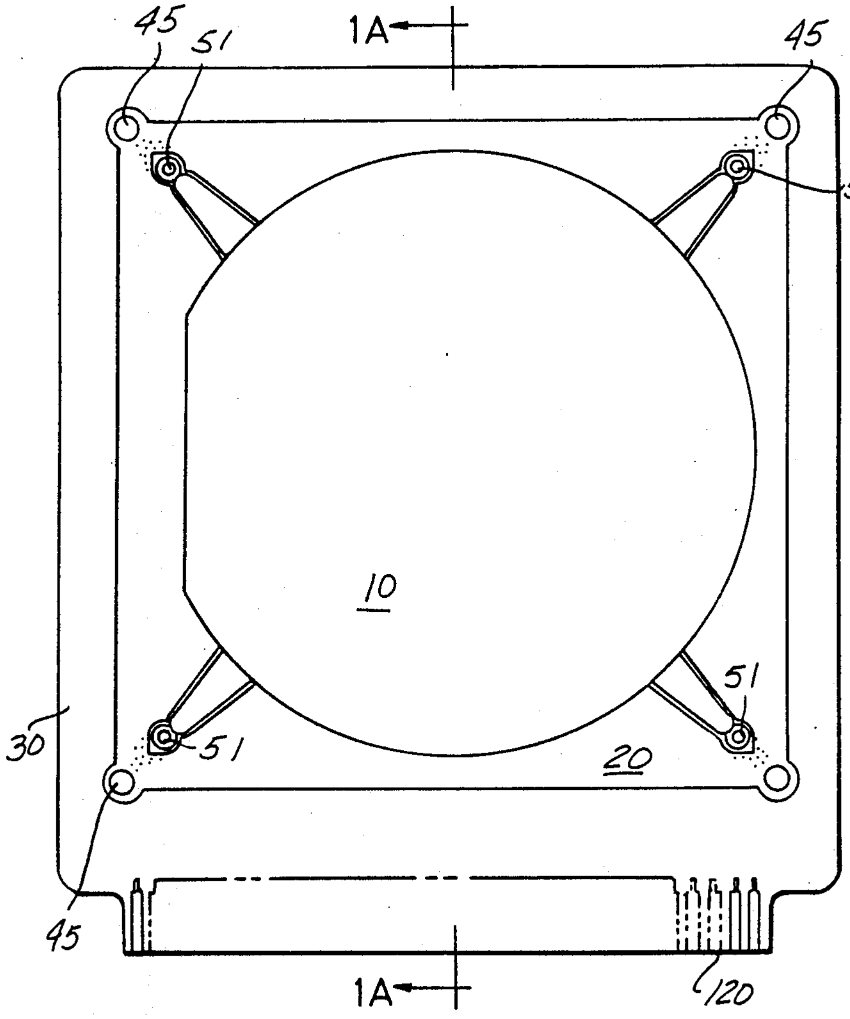
FIGS. 1 and 1A are respectively a view and section of the preferred embodiment of our wafer scale package system.

Referring to the drawings in greater detail, the reader should understand that we have disclosed herein, our preferred embodiment by way of example, and alternative embodiments to our inventions and discoveries. The features which are common to all embodiments have been disclosed once. Thus we will utilize a single description of these common features in this description.

Figure 1A:
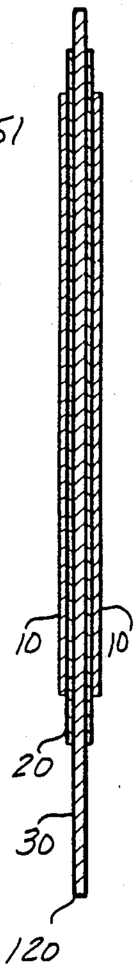
Figure 2:
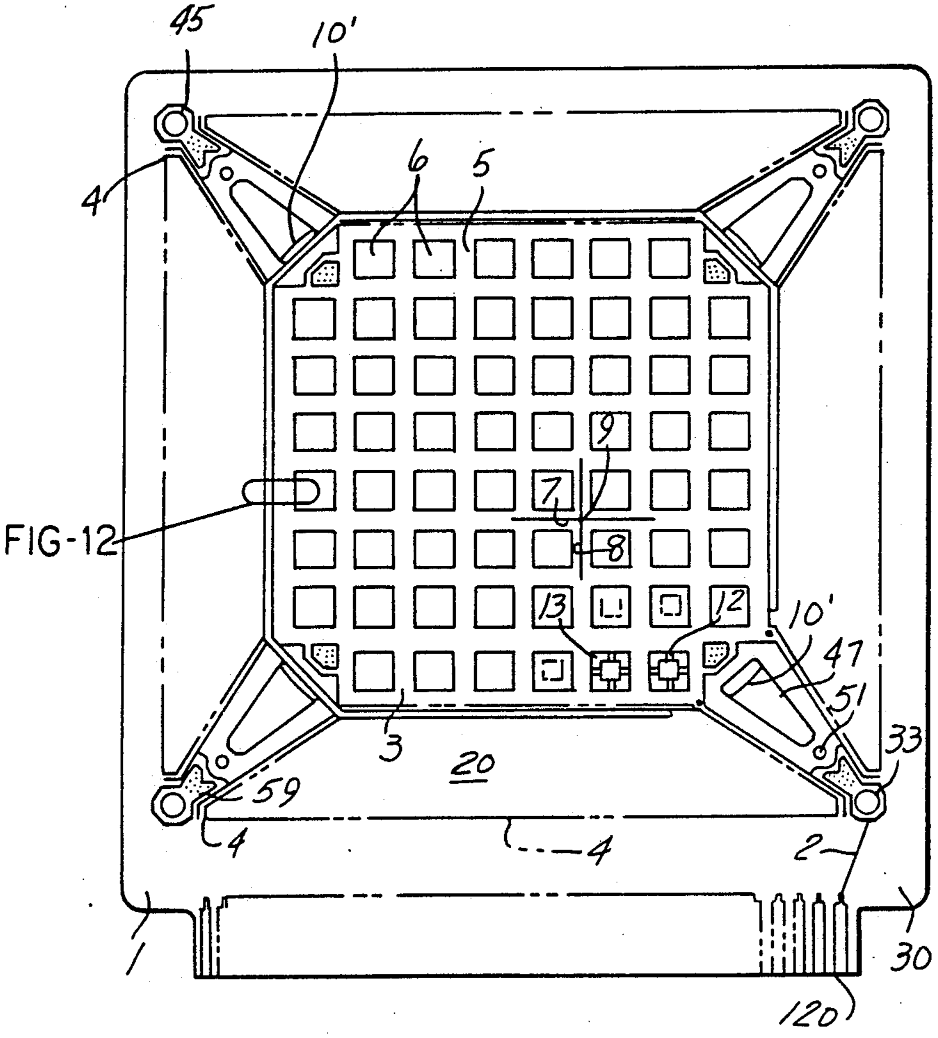
FIG. 2 shows an alternate embodiment of FIG. 1.
Figure 3:
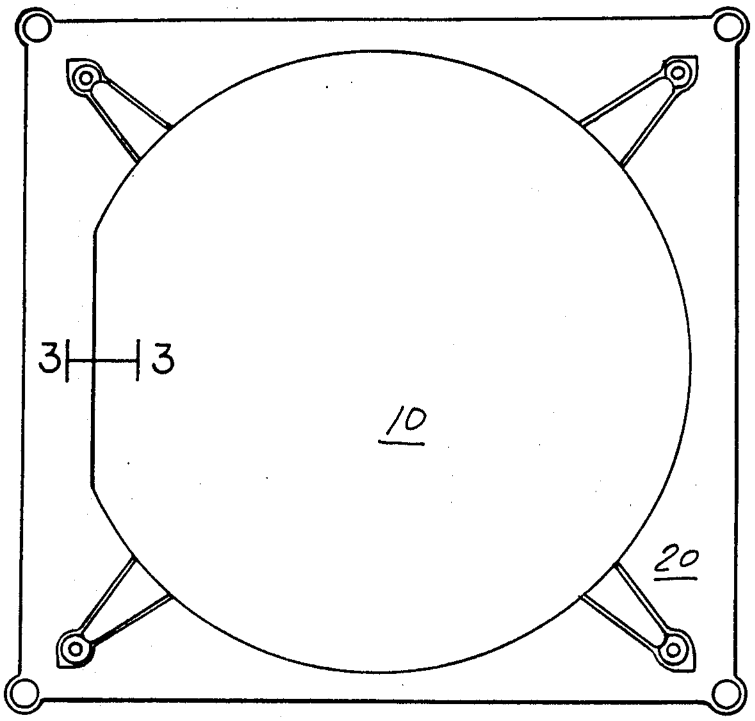
FIG. 3 shows the package system of FIG. 1 before it is mounted on the support board.
Figure 9:
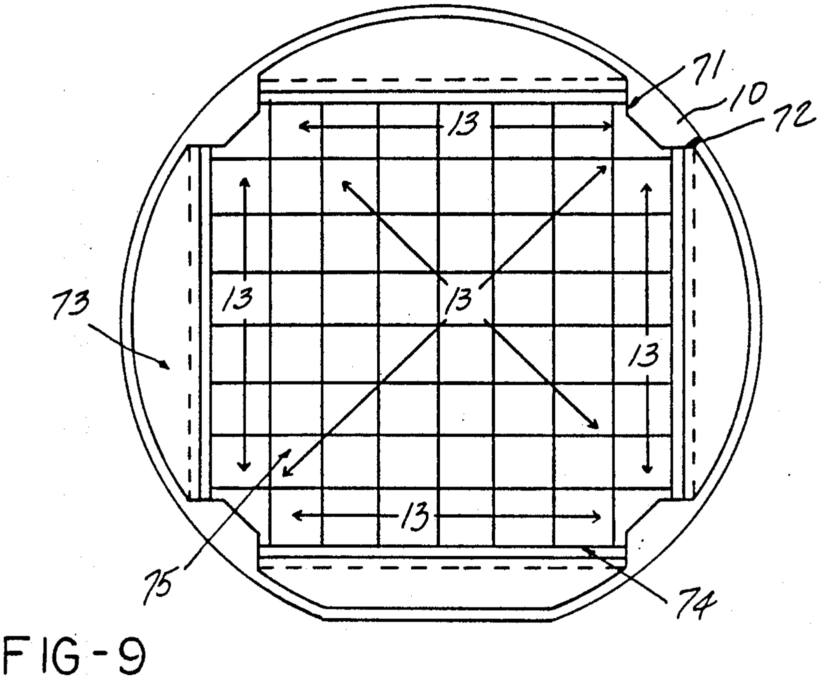
FIG. 9 shows a top view of a wafer which may be used in the wafer scale package system.

The wafer 10 is shown in FIG. 1. The same wafer is shown in FIG. 3, also numbered 10, showing the header 20 before it is mounted on the board carrier 30. The wafer itself is generally described with reference to FIG. 9 and features of the wafer shown in FIG. 9 are shown in FIGS. 3, 4, 10 and 11–14. The wafer is also shown in FIG. 2 which discloses our alternative packaging embodiment which is preferred in some situations instead of a preferred embodiment of FIG. 1. FIG. 1A shows a cross section of the preferred embodiment taken along line 1A showing how two wafers are mounted on board 30.

Figure 8:
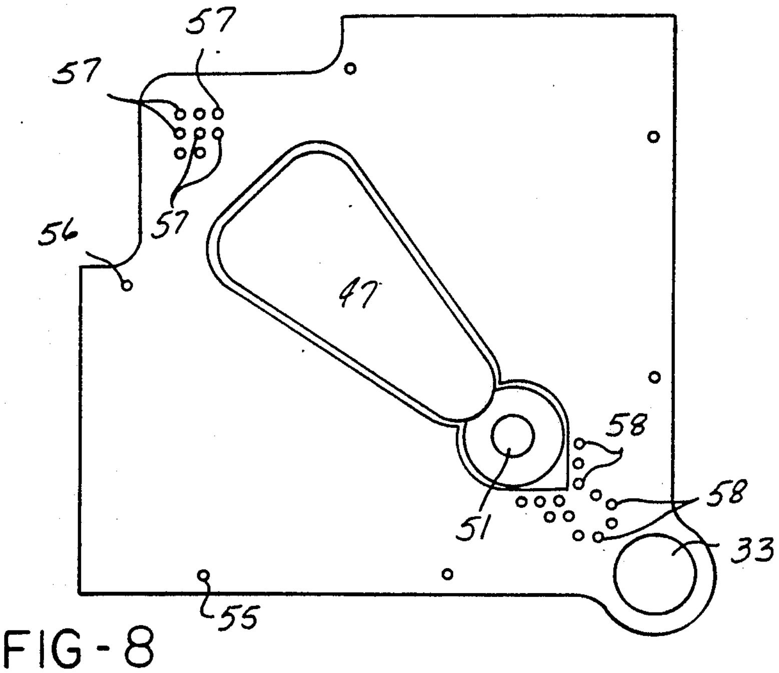
FIG. 8 shows a finished view of the corner view of FIG. 7.

Turning now to FIG. 2 is the example of the wafer, each wafer has a cell areas 3 on which are mounted or deposited integrated circuits 6 similar to those shown as chips 11. These chips 11 are understood to be either directly formed on the wafer or placed on the wafer and interconnected to the wafer by means of downbonding wires 12. When hybrid circuits are incorporated on a wafer with an interconnection substrate one bonds the circuits to a cell area 3 at bonding points on the interconnection wafer. Interconnecting various circuits as integrated circuits 11 on the wafer are orthogonal lines 8 and 7 representing vertical and horizontal lines acting as padlines or netlines generally referred to as net or network lines, which are formed on the wafer 10. These lines may be programmatically interconnected at point 9. These may be formed in the in-between cell areas 5 as well as under the cell areas 3 as shown in FIG. 8. In addition, cell areas 6 may be formed on the wafer itself, with or without the illustrated hybrid circuit configuration, which can be for example monolithic memory which is interconnected to another cell area 3 or 13 via the interconnection lines 7 and 8. These cell areas can also support independent hybrid integrated circuits 11 and interconnected thereto via bond wires 12.

In order to connect the generally described wafer scale integrated circuit device one embodiment of which is shown in our copending applications U.S. Ser. No. 445,156, previously referenced in application Section No. 360,177, filed Mar. 22, 1982 and entitled Computer Apparatus and Method of R.R., by Johnson et al, which is herein fully incorporated by reference, some means is needed to connect the wafer scale device to the outside world.

We accomplish this by the use of the wafer 10, a header 20, which in turn is connected to a printed circuit board 30 in the form of a wafer scale package system. The wafer, header and board package system is shown in FIGS. 1. 2 and 3 with details shown in additional figures.

As shown in FIG. 1, our preferred embodiment, the wafer is mounted backside out on the printed circuit board and connected to the header such that the integrated circuits 6 and 11 are disposed toward the printed circuit board. In the alternative preferred embodiment is shown in FIG. 2, these devices are disposed on the printed circuit board 30 facing outwardly.

In both embodiments the header 20 is a substantially identical device. The cross section of the header 20 is represented generally in FIG. 5. It is a flexible circuit intended to facilitate the connections from the wafer scale device to the next higher level of package and/or first wiring on the board 30 as described further herein. It provides at least 800 signal lines including 32 signal ground connections for a net of 768 signal lines as well as additional connections for power ground and power (single voltage). As shown in FIG. 2 section the header is fabricated from a thin insulator 21. Preferably manufactured from Kapton or alternatively Mylar and approximately 25 microns, that's 25 um (1 mil) thickness. This insulator 21 is coated on the top with an adhesive such as Pyralux or its equivalent as adhesive 22 which is approximately also 25 microns (1 mil) thick. Similarly, on the bottom an adhesive 23, Pyralux or its equivalent, is applied to the bottom of the insulator 21. A top conductor 24 is applied to the adhesive 22. This is preferably of copper, approximately 60 microns (2.4 mil) thick. Also preferably made of "one ounce copper". Similarly a like bottom conductor 25 is similarly affixed with adhesive 25 to the insulator 21.

The top surface is flash plated with a top surface plating 26. This top surface plating is gold, at least 1.2 micron (50 micro inches) thick, over nickel which is also at least 1.2 micron (50 micro inches) thick.

On the bottom surface 27 is similarly Flash plated a bottom surface plating 27 of gold over nickel each approximately 1.2 micron (50 micro inches) thick.

While details of the header 20 will be described in greater detail, an understanding of the manufacturing method coupled with the particular features which are important for the header 20 will be first described.

Figure 5:
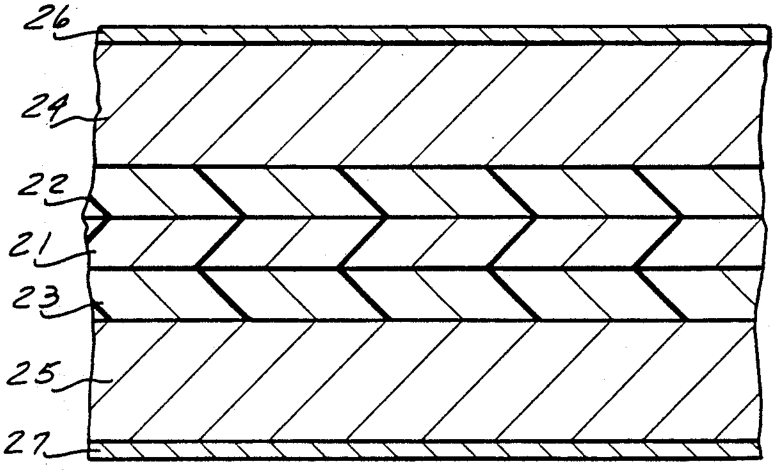
FIG. 5 shows a section of the header.

As shown in FIGS. 5 and 1, the top (top means the surface viewing the reader in FIG. 1, and hidden from the reader in FIG. 2) metal layer, which is preferably in this orientation predominately a ground plane, is a part of the FIG. 1 preferred embodiment which is mounted on the printed circuit board so as to face the reader. The bottom layer, which is the metal layer carrying signals from the inside or wafer to the outside world is not shown in FIG. 1. In an alternative embodiment shown in FIG. 2, the top layer is shown facing the inside or printed circuit board side of the assembly while the top layer or ground plane is hidden from view. Thus preferred embodiment in FIG. 1, and the alternate preferred embodiment in FIG. 2 show essentially the same header 20. The orientation of the header in the different preferred embodiments has significance which will be described below.

The signal ground layer or bottom plated layer of copper and gold of FIG. 5 (which is shown in mask FIG. 2B) also contains structure used in the manufacturing process of plating and drilling. These process parts are discarded when the header is trimmed to size. The signal ground plane is shown in view in FIG. 2.

The first step of the manufacturing process of the header is to prepare a large sheet of material, from which say twenty headers will be fabricated. This sheet is a lamina composed of the flexible insulator 21 and the copper layers 24 and 25 including the adhesive layers 22 and 23.

During the manufacturing process the ground layer or top layers 24 and the signal ground layers 25 are replicated to produce the multi-header mask used by the manufacturer. The insulator layer has holes drilled therethrough. Some of the structures in the signal ground masks are formed with openings 45 as seen in FIG. 2 in the metal layers so as to show the location of the holes to be drilled through the insulating layer 22. The multi-header single ground mask is used to set up an automatic drilling machine using the openings which will be described. The manufacturer may add alignment marks outside the active header area for his own use so that in the manufacturing process alignment holes may be drilled in the sheet in areas which be later discarded.

As holes are drilled an electroless plating process is used to deposit copper in the holes and at least 0.5 mil of copper is plated on both the sheet and in the holes. A photo resist is added to both sides, and exposed using two multi-header masks. Since the openings in the signal ground layer 25 for drill positions are smaller than the holes drilled in the material, the resist will fill the holes and protect the edges from etching. Both sides of the sheet are then etched in one step, leaving a number of header patterns all of which are temporarily connected together in a single circuit (for additional plating). The resist is then removed.

Additional copper is plated on the circuit, in part to compensate for undercutting the resist etching, and in part to increase the thickness of the metal lines and the amount of copper in the plated through holes. The next step in the plating operation adds the layer of nickel to the circuits. A flash of gold is then added immediately, to preserve the nickel surface. Since gold is so expensive, the ground side 24 is masked to prevent further plating. Additional gold is then plated, to provide a good surface for wire bonding. Then the plating mask for the signal ground side 24 is then removed. Then individual headers are cut from the initial sheet, using either a steel rule die or hard tooling. The initial alignment holes which will be described are also used in this punching operation.

Figure 6:
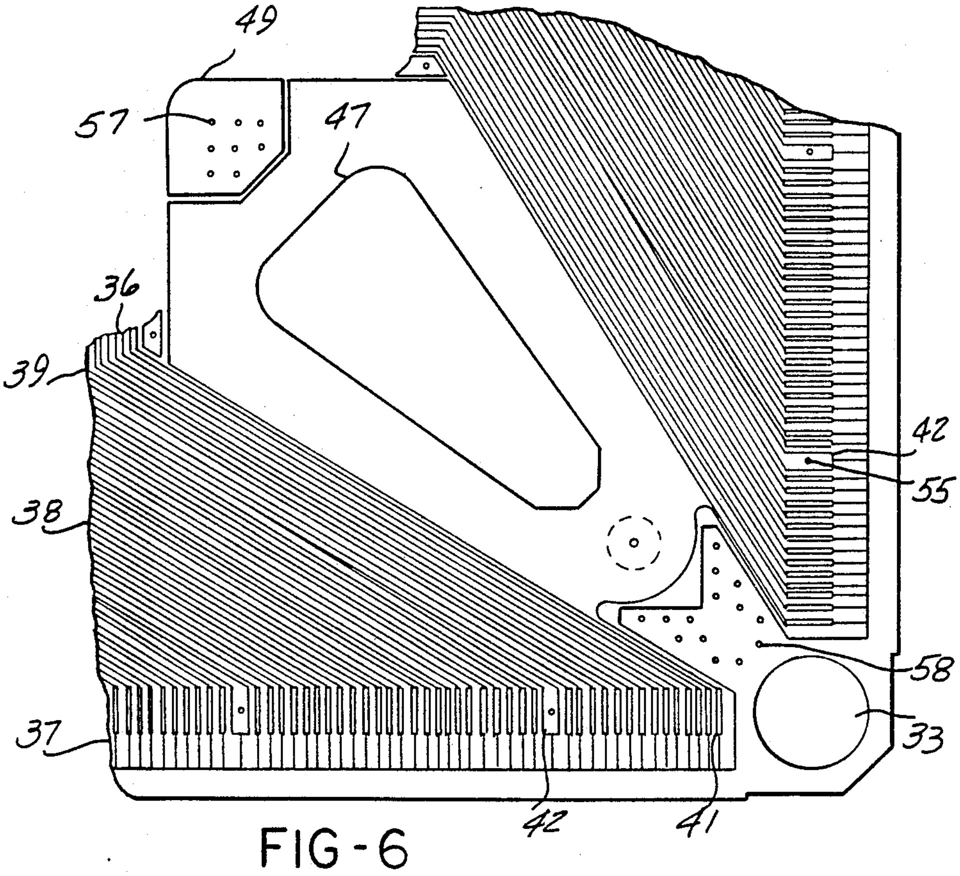
Figure 6A:
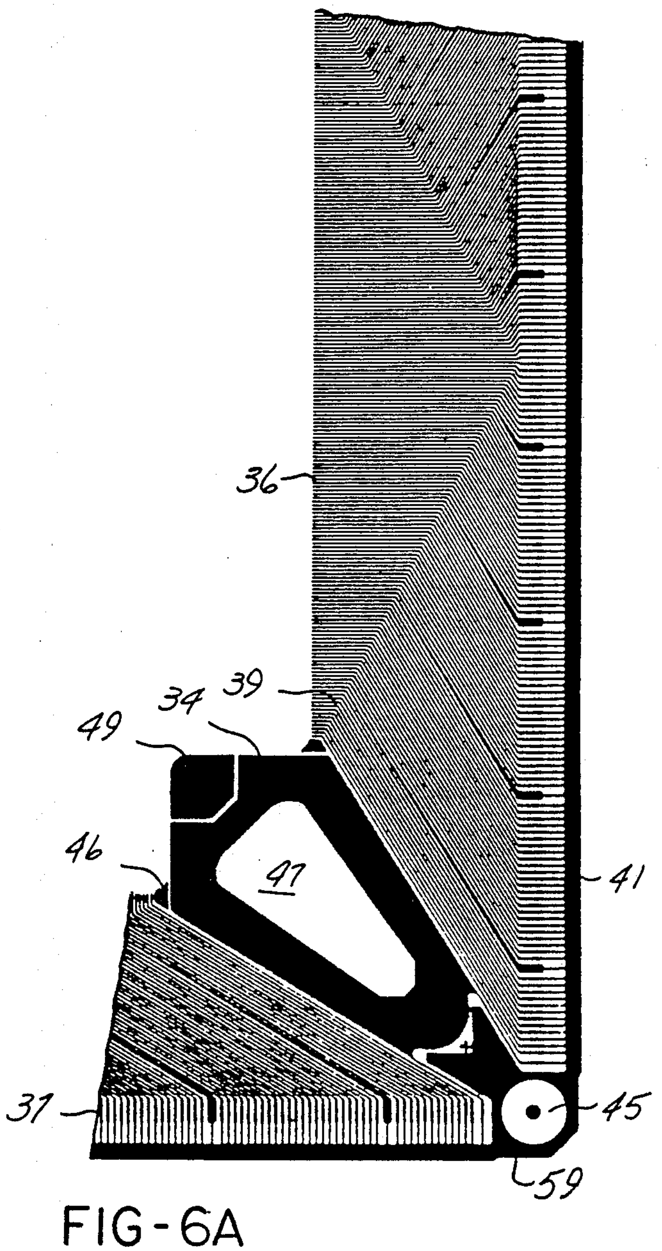
FIG. 6A shows a mask for FIG. 6.

FIG. 6 shows the signal ground layer of the header before it is trimmed. When it is trimmed it follows the drawing shown in FIGS. 1, 2, 3, and 6. FIG. 6A also shows a mask of the signal ground layer of the header 20 before it is trimmed which shows in more detail but in negative form the linear side of header 20.

Generally as shown in FIG. 6A, the header has a group of signal and ground lines which are adapted to be connected to the wafer itself and which run to the outside world. Each side of the header has 200 signal lines including 8 signal ground connections. The signal lines run directly from inside of the header in parallel and at some point on a V-shaped spreadline 39. The direct connect inside signal lines 36 turn at an angle of approximately 120 degrees and continue toward an outside connecting area 37. The angular lines 38 then turn at the same angle and connect to bonding pads in the area 37. The width of the bonding pads in the area 37 differ. Lines which act as signal ground lines 42 are wider at the outside bonding point, so as to permit a via hole 55 through to the ground plane (the top surface shown in FIG. 5) as shown in FIG. 3 and 8. The other bonding pads 41 which in FIG. 6 are approximately twice the width of the signal lines shown as 38 and 36.

The header is fabricated preferably as a generally rectangular or square shaped final device having alignment holes 33, not through plate, punched in each of the four corners. Each of the four corners has a pattern formed thereon which is substantially identical at each corner. The alignment holes 33 that are not through plated are punched out as shown in FIGS. 3, 1 and 2. These alignment holes are used to position the header itself in position for soldering onto the printed circuit board 30. At each corner are also four through plated holes 51 which are used for power hook-up, and four corner cut-outs 47, to be considered corner apertures. The purpose of them will be described in greater detail hereinafter. The corner alignment holes 33 are used for alignment, mounting and for ground hook-up. The plated through holes 51 are used for power hook-up to the bottom area 34 and the four corner flexure apertures or cut-outs 47 are utilized for obtaining linear movement of the sides of the header after attachment to board 30 as well as, also importantly, to enable grasping of the header by a holding fixture during subsequent manufacture. The four V-shaped corner cut-outs 47 have a wider section aperture nearer to the center square donut-hole area of the header and are narrower across the edge adjacent the corners. This permits the edge of the wafer 10 to be gripped directly by a fixture in a subsequent manufacturing operation. The wafer can be seen in FIG. 2 from the bottom side and the wafer can be seen in FIG. 1 from the top side. The round plated through holes 51 and the four corner cut-outs need not be but can be plated through. In addition the header contains 138 small via holes which are used exclusively for electrical connections between the top and bottom metal layers. The drill diameter of these holes is approximately 0.5 micrometers or 0.018 inches before plating. The holes are plated through and it doesn't matter whether or not the holes are closed by the plating process. Locations of these via holes are marked by holes drill size in the mask to be used for the patterning of the metal layer.

Figure 7:
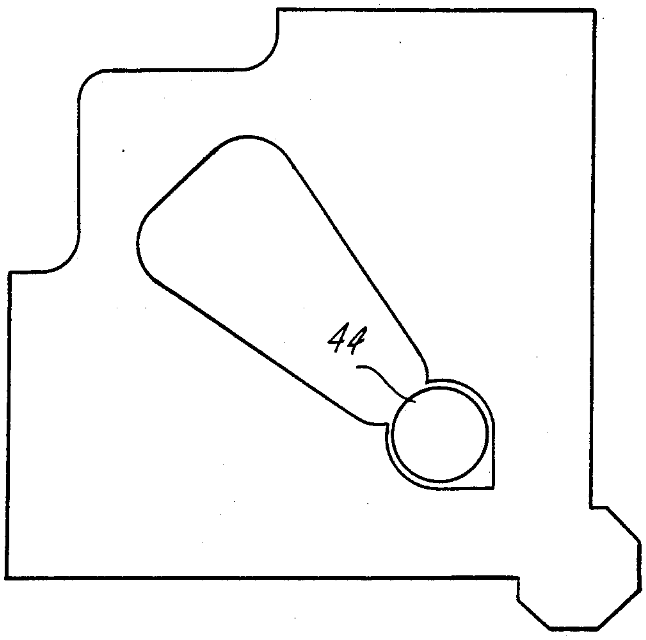
FIG. 7 shows the same corner as FIG. 6 in a view of the other side of the header in an intermediate step of manufacture.

Each side of the header along the outer edge has 8 via holes 55 in FIGS. 6 and 8 through the signal ground lead 42 on the bottom of the header which connects through to the top ground plane of the header. Again, the top and bottom in the FIGS. 1 and 2 may be thought of as being reversed. The primary consideration is that the ground plane is the metal conductor which is shown in detail in FIG. 8. FIG. 7 is a detail formed prior to the use of the blanking die, being representative of an intermediary step in the manufacturing process prior to FIG. 8. In FIG. 8 there is shown one corner of the wafer in greater detail which shows a number of via holes. Included therein are, on each side, two of the 8 via holes 55 along the outside edge of the header which connects the center signal ground line of a group of 25 lines to the ground plane which is the top of the header in FIG. 1. The center lines or signal ground lines do not have a common ground connection at the inner edges of the header. Instead of a ground connection area 49 at the inner edge of the header is each provided with a total of 8 via holes 57 is provided for each of the sides of the four fields with 200 lines each.

Thus, as shown in FIG. 6, at each corner are located 8 inner corner via holes 57 which connect the power ground bonding area of the back of the header which has the main pattern to the ground plane top of the header seen in FIG. 8. Also at each corner of the signal lines are inner ground via holes 56 which connect to the ground.

In addition, at each of the outer corner areas of the header there are 14 external power ground hook-up area via holes 58 connect the external power ground hook-up area 59 to the top ground plane (FIGS. 6 and 8).

Adjacent the V-shaped corner cut-out on the top side is a round solder splash area separated from the ground plating by a circular area of insulator. The purpose of this is to prevent solder splash from the voltage hole 51 utilized for power hook up so that it does not connect to ground.

Figure 4:
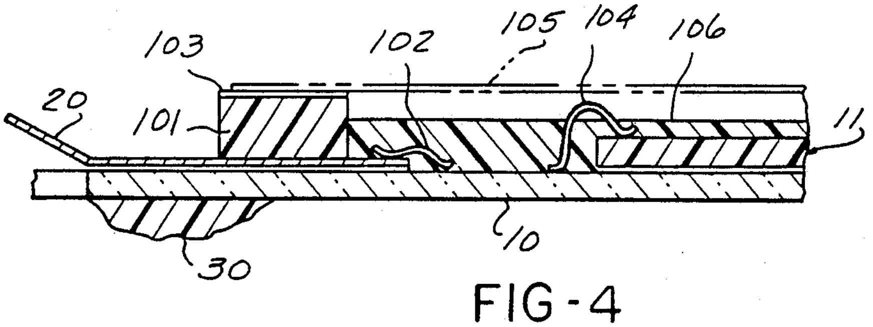
FIG. 4 shows a wafer package of FIG. 3 in partial section taken along line 3—3 of FIG. 3.

Turning now to FIG. 2, the circled section of FIG. 2 is shown in more detail in FIG. 4. The FIG. 2 section shown in FIG. 4 will be described in greater detail. It will be appreciated that FIG. 2 is a view which shows the lid of the package removed. Thus in FIG. 4 the underlying printed circuit wafer package support and interconnect board is shown as bearing an encapsulated wafer 10 of the hybrid type. This encapsulated wafer bears chips 11 which are downbonded to the wafer 10. The printed circuit board 30 is not shown in full detail in FIG. 12. The header 20 is physically attached to the wafer 10 and adhesively attached to the header is a package side wall 101 to which a lid 105 is attached by a lid adhesive 103. Chips 11 are adhered to the wafer 10 adhesively. The bonding points on each chip are connected to a bonding point on the wafer 10 via bond wire 104 and another lead from the wafer 10 is connected to a signal lead 102 by another bond wire. The entire device is potted by a polymer encapsulant 106 and the lid adhesively attached.

In FIG. 2 the wafer is shown with its face up. Alternatively and as preferred as shown in FIG. 1, the wafer has the ground plane of the header up and the patterned signal ground side down, for connection of the lines on the header to the outside world. These may be connected either directly to another port, signal line, or another wafer by a bus structure. This may be inserted into a slot bus fixture to form a main frame. Which of the slot connectors 120 are connect to which bonding pads on the header is a matter of specific adaption to a purpose required of the device.

Figure 10:
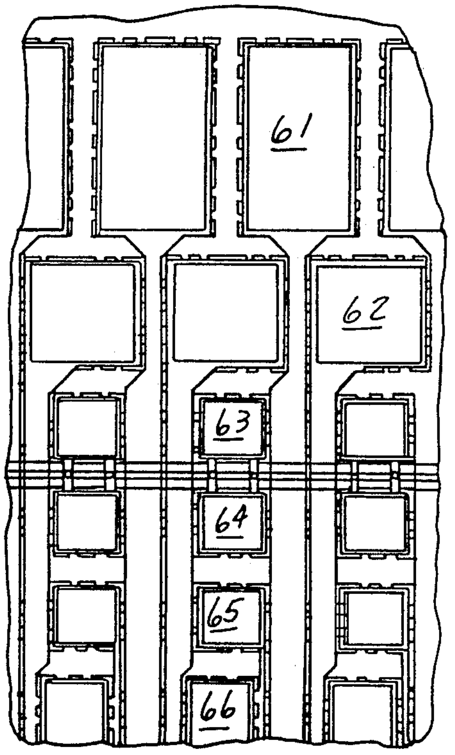
FIG. 10 is a microscope view of the connection edge of the wafer of FIG. 9.
Figure 11:
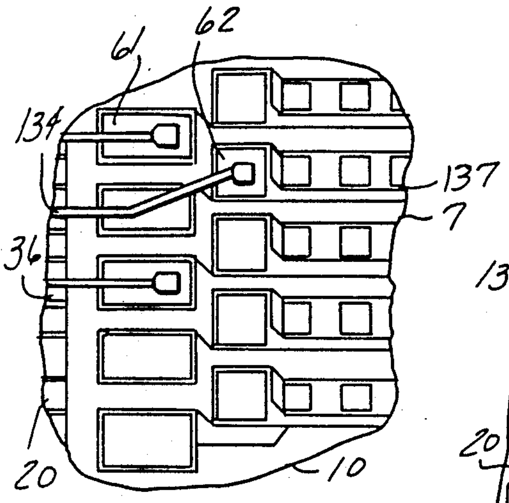
FIG. 11 shows a microscopic view like FIG. 10, showing a header edge showing alternate bonding.
Figure 14:
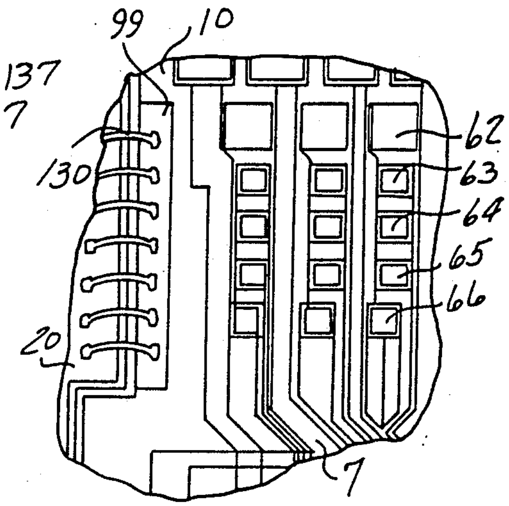
FIG. 14 shows a closer view of the top portion of FIG. 13.
Figure 12:
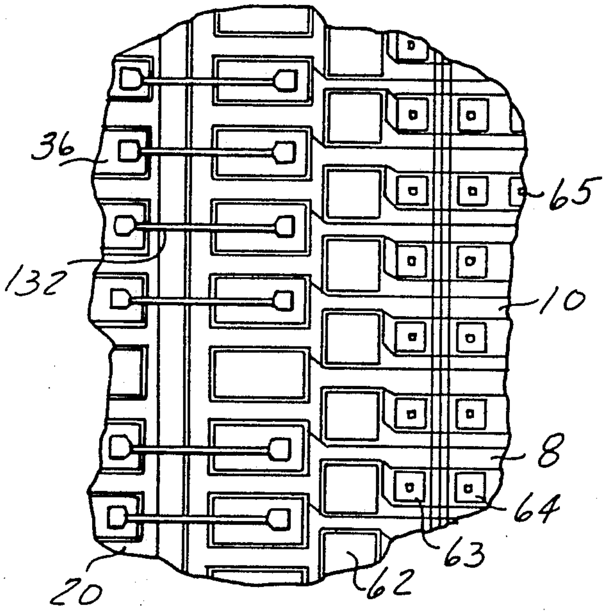
FIG. 12 is a view like FIG. 11 showing primary bonding.
Figure 13:
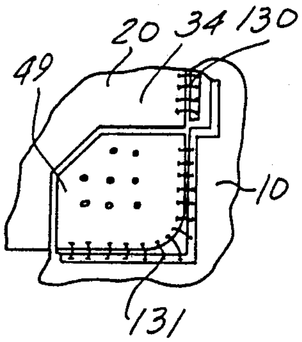
FIG. 13 shows a corner of the header and wafer.

Each wafer has a connection rim of a wafer 10 as shown in FIG. 9. The rim structure area 74 is shown in part in an enlarged size view FIG. 10 and also shown in details in FIGS. 11 and 14. In FIG. 10 is shown a design portion of the rim 74 of FIG. 9 in which 61 is a primary bonding pad and 62 is a secondary bonding pad which is used for an alternate bonding site in the event there is something wrong with the intended netline 7 or 8 attachment at the primary pad 61 and it is needed to have an external signal at that particular point on the header. We have additionally provided two test points 63 and 64 in the wafer connection rim for determining how an anti-fuse is programmed. The area of the rim functions as test points to validate the wafer before we proceed any further after fabrication. Probe or bonding points 65 and 66 are additional probe points to check the continuity of the netline 7 or 8 segments, so that one can get on one end, for example at a primary pad 61, and test whether that point can be connected on one other side of the wafer at a probe point 65 on that other side of the wafer. By probing the two points we can verify that the line segment 7 or 8 extending from pad 61 on one side to a test pad 65 on the other is in fact connected with no openings. FIGS. 11 and 14 show bonding at various points at the edge of the wafer to the header. As seen in FIG. 13 a corner which has a ground bonding area 49 to the ground plane and a voltage bond site 34 both of which use a plurality of voltage and ground bond wires 130 and 131. FIG. 12 shows the number of signal bond wires going from the primary pads directly over to the cross-bonding position 36 on the header. FIG. 11 also shows an alternate bond wire 134 connecting from a secondary pad 67 to the corresponding position 36 on the header. This is the connection that is used in the event that there is a problem with the netline 7 associated with the primary bonding pad site. We can go to an alternate one to pick up an adjacent redundant netline 137.

The FIG. 14 shows how multiple connections need to be made from the ground point (like the voltage connect point) on the rim 74 from the power point 99 on the rim 44 to the voltage portion 34 on the header. Similarly, the multiple bonds would be made from a similar ground point connection on the rim to the ground point 49 on the patterned surface of the wafer which is connected then to the ground top of the header by way of the via holes 57 as shown in the sketch FIG. 13 and FIGS. 8 and 6.

Figure 15:
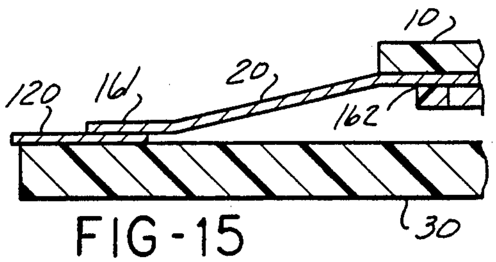
FIG. 15 shows a partial side section sketch of the wafer system package of FIG. 1.
Figure 16:
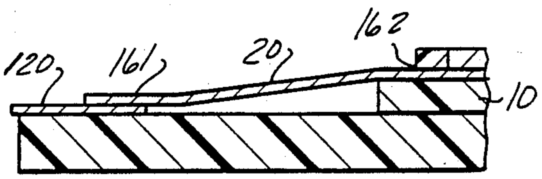
FIG. 16 shows a partial side section sketch of the wafer system package of FIG. 2.

FIG. 15 is a schematic representation of the mounting of a wafer on a printed circuit board in accordance with FIG. 1 while FIG. 16 is a similar schematic showing the mounting of the wafer device on a printed circuit board in accordance with FIG. 2.

Figure 18:
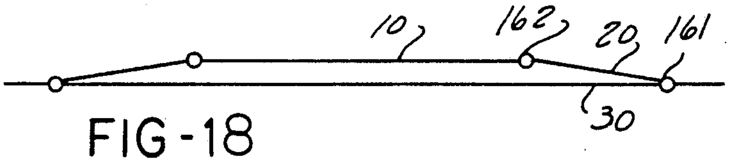
FIG. 18 shows a mechanical schematic of FIGS. 15 and 16 at a higher temperature than FIG. 17.

FIG. 18 is a schematic mechanical view of the wafers of FIGS. 14 and 15 at the time the wafer is mounted on the printed circuit board or at the period of high-temperature operation.

Figure 17:
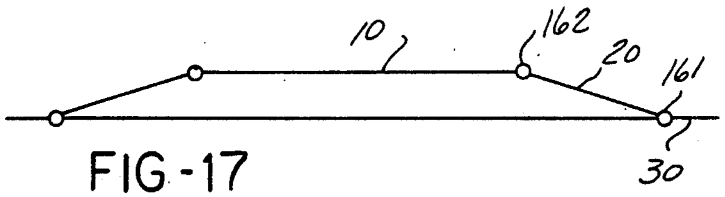
FIG. 17 shows a mechanical schematic of FIGS. 15 and 16.

FIG. 17 is a view of the printed circuit board of FIGS. 14 and 15 when the wafer is in operation in a cooler environment.

Referring now to FIG. 18, the header 20 is mounted on the printed circuit board 30 with the wafer 10 in place. Essentially the header and wafer are at the time of mounting in the form as shown in FIG. 3. Preferably the header is bonded to the printed circuit board at a high temperature so that the header is elongated between printed circuit board bonding point 161 and wafer bonding point 162. Thus, the header leads are made to contact corresponding leads 120 of the printed circuit board. In this manner, the lines from the wafer 10 exit through the header 20 to the leads 120 on the printed circuit board. There they are connected to the outside world. Mechanically, there may be some thermal difference in the coefficient of expansion between the wafer 10 and the printed circuit board 30. The use of the flexible header allows the connection to compensate for changes in temperature. When the circuit board normally has a slightly higher coefficient of expansion than the wafer assembly 10 and a mechanical representation of this high temperature is shown in FIG. 18, that is at a temperature of say approximately between 150 and 200 degrees or even higher as at a solder temperature below temperature which will affect the wafer package but higher than the normal maximum storage temperature say 100 degrees. When this board cools it contracts and lifts the wafer slightly from the printed circuit board as shown in FIG. 17. Thus, pivot points 162 and 161 enable the header to compensate for varying temperatures in operation of the device. The flexible aperture 47 at each corner of the wafer allows for the expansion and contraction and permits a square or linear lift on each side of the wafer package.

Figure 19:
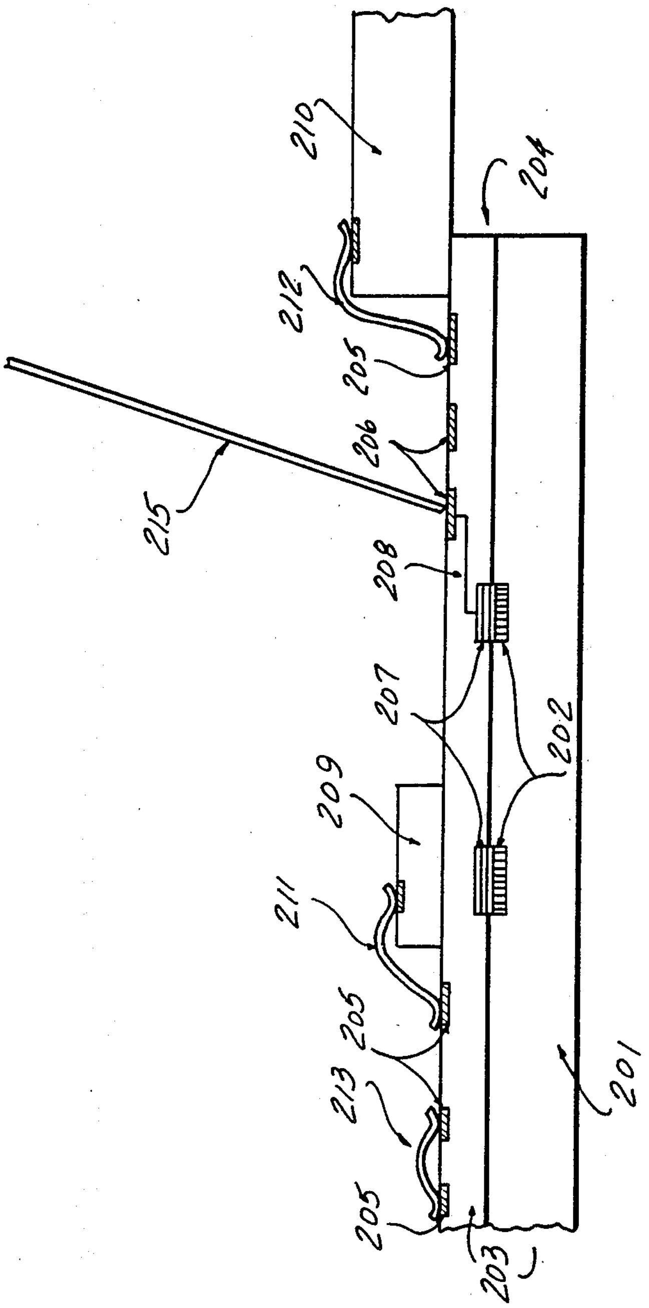
FIG. 19 is a schematic cross-section of a preferred wafer device which is part of the wafer system.

FIG. 19, is a single drawing illustrating the preferred wafer embodiment of our invention as disclosed in U.S. Ser. No. 532,391.

The details of FIG. 19 can be understood by those skilled in the art who know that a wafer is usually a very thin cylinder of silicon on which die are deposited. FIG. 19 represents a cross section of that silicon wafer and of the other items we use and which we shall describe.

In U.S. application Ser. No. 225,581 continued as U.S. Ser. No. 445,156 incorporated herein by reference, there was disclosed a wafer substrate for integrated circuits which by itself may be made either of conductive or non-conductive material. This substrate, in the present invention, references the base monolithic wafer. This substrate for net and pad lines carries two planes or layers of patterned metal, thus providing two layers of interconnection. This patterned metal is considered to be an interconnection system within the meaning of this application. In the prior application, as now known from that application, the metal layers can have connections which are formed by amorphous semiconductor material. This, is by way of an amorphous via, as described therein. Connections between the metal layers or between the metal layers and the substrate can be made through via holes in the insulation layer between metals or between layers respectively. In this prior application, and in the presently described embodiment, the real estate of the wafer is divided into special areas called cells and signal hookup areas and power hookup areas are provided. In the prior application, it was disclosed that the cells were intended to host integrated circuit chips in a hybrid system of chips and metal layers with the interconnections providing signal connections between the chips on the surface Unlike the prior application, this embodiment utilizes a different substrate. The preferred substrate has been replaced by a silicon wafer 201 (corresponding to 10) with active die incorporated on it, which die are isolated one from the other, and which each have die contact sites 202 normally used for probing during testing and for bonding during packaging. To the wafer 201, and on the upper die carrying surface, has been layered a thin adhesive layer of polyimide resin insulation layer 204. This resin, during the process of manufacturing the monolithic wafer, is cured and then etched to provide holes through the surface of the wafer to the die contact sites 202 so that these are covered temporarily. The resin performs the principal task of smoothing the surface of the wafer, which is important to subsequent processing and improves step coverage. Thereafter during the process of manufacture of the monolithic wafer a thin film interconnection system 203, of which the prior interconnection system which has been incorporated by reference as a preferred example, is deposited on the insulation layer 204.

The interconnection system 203 has incorporated therein its own contact sites. On the upper surface are bond contact sites 205, situated at sites suitable for wire bonding. There are probe contact sites 206 suitable for probing with a test probe 215, and there are coupling contact sites 207 suitable for coupling of the interconnection system to the underlying die at die contact site 202. While in general any contact site may be coupled to any contact site, there is a special direct connection 208 between the probe contact sites 206 and the coupling contact sites 207 for the purpose of making direct test access to the buried contact site of 207 and coupled die contact site 202.

One should note here that wafers with isolated die formed thereon are common techniques in the intermediate process of making circuits. The wafer of the preferred embodiment is made like these wafers. The interconnection system which has been described, is programmable in the manner taught by the aforementioned prior application so that interconnection can be made for signal purposes throughout any or all of the dies on the wafer, which previously had been isolated. The underlying die can be a plurality of 64K or 256KRAM die, and these can be unified into a mass memory.

These die can be unified into a full system, which can include instruction processor chips, I/O interfaces, and many other chips which are required to make a full system. The die can be replaced, if not in working order or unwanted, by a substitute die. The additional chips used to make a full system or the substitute die can be placed over the die on the wafer by adhesively bonding the downbond hybrid chips 207 carrying the desired circuits where they are placed on the surface on the interconnection system 203. Then a wire bond 211 is made to selected bonding sites, as from a site on the chip 209 to an upper bond contact site 205. Similarly, an upper bond contact site 205 can be used to bond an external wire bond 212 to a printed circuit board 210 but preferably to a header 20. Stitch bonds 213 may be made between upper bonding sites 205 of the wafer. All of the interconnections of the system make the wafer into a true monolithic wafer, and when additional or substitute chips are downbonded to the surface of the wafer we consider this a hybrid monolithic wafer system. This wafer system is preferably packaged in the system employing the previously described header.

The inventions and discoveries claimed herein have been described in various examples. The combinations claimed include the specific examples, and combinations of specific examples and combinations of parts of the specific examples. After a review of this description, those skilled in the art, both now and in the future, will envision modifications and alterations which may be equivalent of the inventions and improvements and their combinations claimed. Such modifications should be deemed to be within the scope of the claims when utilizing the inventive nature of our inventions. This is a new technology, and it is believed this disclosure extends beyond what was possible before our disclosure.

What is claimed is:

1. A wafer scale package system, comprising:

a substantially rigid wafer based substrate which supports a plurality of integrated circuits, said substrate including a network of electrically conductive lines for selectively interconnecting said circuits together on said substrate, and a plurality of sites disposed generally around the periphery of said substrate for enabling external electrical connections to be made with at least some of said lines;

a substantially rigid circuit board; and flexible header means disposed generally between the periphery of said substrate and said circuit board for providing a flexible interface between said substrate and said circuit board, said header means having a plurality of inner sites for facilitating selected electrical connections between said substrate and said header means, a plurality of outer sites for facilitating selected electrical connections between said header means and said circuit board, and an electrically conductive line extending between and joining corresponding pairs of said inner and outer sites, and said header means being formed to permit said substrate to move relative to said circuit board in response to relative thermal expansion and contraction of said substrate with respect to said circuit board, so as to permit said substrate to lift slightly from said circuit board in response to a predetermined change in temperature; and wherein said header means has aperture means for permitting a linear lift of said substrate with respect to said circuit board.

2. The wafer scale package system according to claim 1, wherein said aperture means comprises a plurality of apertures.

3. The wafer scale package system according to claim 1, wherein said aperture means comprises an aperture disposed at each corner of said header means.

4. The wafer scale package system according to claim 1, wherein each of said apertures has a "V" shape.

5. The wafer scale package system according to claim 1, wherein said integrated circuits are formed on said substrate.

6. The wafer scale package system according to claim 1, wherein said header means comprises a flexible multilayer frame having a quadrangular central aperture adapted to receive said substrate.

7. The wafer scale package system according to claim 1, wherein said substrate has a connection rim which provides a linear array of primary sites for making external connections from said substrate to said header means, secondary sites for making alternate external connections from said substrate to said header means, test sites for checking the connections desired between said integrated circuits, and probe sites for checking the continuity of selected interconnection line segments on said substrate.

8. The wafer scale package system according to claim 1, wherein said header is connected to said substrate and said circuit board at a high temperature.

9. A wafer scale comprising:

first and second substantially rigid wafers each including a network of electrically conductive lines for selectively interconnecting a plurality of integrated circuits on a mounting side thereof;

a substantially rigid circuit board; and first and second header means for providing a flexible interface between said wafers and said circuit board, said first header means being connected to said first wafer and said circuit board such that integrated circuits on the mounting side of said first wafer are disposed toward said circuit board, and said second header means being connected to said second wafer and said circuit board such that integrated circuits on the mounting side of said second wafer are disposed toward said circuit board and wherein each of said headers means has aperture means for permitting a linear lift of said wafers with respect to said circuit board.

10. A header for providing a flexible interface between a wafer bearing and interconnecting a plurality of integrated circuit dies and a circuit board, comprising:

a flexible multilayer frame having a quadrangular central aperture adapted to receive said wafer, said frame being comprised of a thin and substantially flat insulator layer;

a first metal layer affixed to a first side of said insulator layer; and a second metal layer affixed to a second side of said insulator layer;

said first layer having a conductive pattern which provides a ground plane over substantially the entire surface of said first layer; and said second layer having a conductive pattern which provides a plurality of signal lines extending generally from said central aperture to the outer periphery of said frame along each side of said frame, said second layer conductive pattern also providing power and ground areas at each corner of said frame; and wherein said frame includes corner aperture means for permitting said wafer to move in a substantially linear manner with respect to said circuit board in response to a predetermined change in temperature.

11. The header according to claim 10, wherein said signal lines extend initially in parallel relative to each other from said central aperture and then form a generally "V" shape spreadline.

* * * * *